(12) United States Patent
Hayashi

(10) Patent No.: US 7,508,128 B2
(45) Date of Patent: Mar. 24, 2009

(54) ELECTROLUMINESCENT DEVICE WITH BARRIER LAYER STRUCTURE, METHOD FOR MANUFACTURING THE SAME, AND ELECTRONIC APPARATUS

(75) Inventor: Kenji Hayashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 230 days.

(21) Appl. No.: 10/644,573

(22) Filed: Aug. 20, 2003

(65) Prior Publication Data

US 2004/0066137 A1    Apr. 8, 2004

(30) Foreign Application Priority Data

Aug. 29, 2002    (JP)    ............... 2002-250774

(51) Int. Cl.
   *H01J 1/62*    (2006.01)
   *H01J 63/04*    (2006.01)
(52) U.S. Cl. .................. 313/506; 313/498; 313/504; 313/512
(58) Field of Classification Search ............. 313/506, 313/498, 504, 512, 500
   See application file for complete search history.

(56) References Cited

U.S. PATENT DOCUMENTS

| | | | | |
|---|---|---|---|---|
| 4,068,923 | A | 1/1978 | Toida | ............. 349/132 |
| 4,808,983 | A | 2/1989 | Benjamin et al. | ............. 345/90 |
| 5,909,081 | A | 6/1999 | Eida et al. | ............. 313/504 |
| 6,829,023 | B2 | 12/2004 | Goto | ............. 349/113 |
| 6,841,932 | B2 * | 1/2005 | Aziz et al. | ............. 313/503 |
| 6,924,594 | B2 * | 8/2005 | Ogura et al. | ............. 313/506 |
| 2002/0030443 | A1 * | 3/2002 | Konuma et al. | ............. 313/504 |
| 2002/0044111 | A1 | 4/2002 | Yamazaki et al. | ............. 345/83 |
| 2002/0045066 | A1 | 4/2002 | Beierlein et al. | ............. 428/690 |
| 2002/0070663 | A1 * | 6/2002 | Ogura et al. | ............. 313/506 |
| 2003/0218422 | A1 * | 11/2003 | Park et al. | ............. 313/512 |
| 2004/0119403 | A1 * | 6/2004 | McCormick et al. | ............. 313/506 |
| 2004/0248386 | A1 | 12/2004 | Nishitani et al. | ............. 438/478 |

FOREIGN PATENT DOCUMENTS

| | | |
|---|---|---|
| EP | 1 087 366 A2 | 3/2001 |
| EP | 1 109 225 A2 | 6/2001 |
| EP | 1 139 325 A1 | 10/2001 |
| JP | 01-283937 | 11/1989 |
| JP | A 08-111286 | 4/1996 |
| JP | A 8-279394 | 10/1996 |
| JP | 10-125931 | 5/1998 |
| JP | 2001-7340 | 1/2001 |
| JP | A 2002-049333 | 2/2002 |
| JP | A 2002-203861 | 7/2002 |
| JP | A 2002-208491 | 7/2002 |
| JP | 2003-142255 | 5/2003 |
| JP | 2003-142274 | 5/2003 |
| KR | 2001-0104294 A | 11/2001 |

* cited by examiner

*Primary Examiner*—Joseph L Williams
*Assistant Examiner*—Kevin Quarterman
(74) *Attorney, Agent, or Firm*—Oliff & Berridge, PLC

(57) ABSTRACT

The invention provides a low-profile electroluminescent (EL) device, a method for manufacturing the same, and a low-profile electronic apparatus. The EL device can include first electrodes, EL layers disposed on the first electrodes, a second electrode to cover the EL layers, and a barrier layer in contact with the second electrode. At least the surface of the second electrode facing the barrier layer can be composed of an inorganic oxide. At least the surface of the barrier layer facing the second electrode can be composed of an inorganic compound.

15 Claims, 4 Drawing Sheets

ELECTROLUMINESCENT DEVICE WITH BARRIER LAYER STRUCTURE, METHOD FOR MANUFACTURING THE SAME, AND ELECTRONIC APPARATUS

BACKGROUND OF THE INVENTION

1. Field of Invention

The present invention relates to an electroluminescent device, a method for manufacturing the same, and an electronic apparatus incorporating the same.

2. Description of Related Art

Since an electroluminescent (EL) component is vulnerable to moisture and oxygen, the component is sealed with a sealing substrate, which is formed by carving a glass substrate. Methods for carving the glass substrate include, for example, wet etching, sand blasting, and molding. However, each of these methods has advantages and disadvantages in terms of the processing time, the number of steps, and the cost. Furthermore, it is difficult to achieve a low-profile EL device sealing with substrate composed of a glass substrate.

SUMMARY OF THE INVENTION

An object of the present invention is to provide a low-profile EL device, a method for manufacturing the same, and a low-profile electronic apparatus.

An EL device according to the present invention can include a first electrode, EL layers disposed on the first electrode, a second electrode disposed to cover the EL layers, and a barrier layer in direct contact with the second electrode. At least the surface of the second electrode facing the barrier layer is composed of an inorganic oxide, and at least the surface of the barrier layer facing the second electrode is composed of an inorganic compound.

According to the present invention, the surface having an inorganic compound of the barrier layer directly can contact with the surface having an inorganic oxide of the second electrode, thereby improving the gas barrier characteristics of the barrier layer. Furthermore, the barrier layer is directly disposed on the second electrode, thereby achieving a low-profile EL device.

In the EL device, the second electrode may be composed of indium tin oxide or indium zinc oxide.

In the EL device, the second electrode may cover side faces and upper faces of the EL layers.

In the EL device, the barrier layer may be composed of at least one sublayer composed of a silicon compound.

In the EL device, the barrier layer may include a sublayer in contact with the second electrode, the sublayer being composed of silicon oxide.

In the EL device, the barrier layer may include a sublayer in contact with the second electrode, the sublayer being composed of silicon nitride.

In the EL device, the barrier layer may include a sublayer in contact with the second electrode, the sublayer being composed of silicon nitride oxide.

The EL device may further include an insulating layer disposed around the second electrode, the insulating layer being composed of a silicon compound. The barrier layer extends over the insulating layer.

The EL device may further include a protective layer for covering the barrier layer.

The EL device may further include an adhesive layer disposed between the barrier layer and the protective layer.

In the EL device, the adhesive layer may be composed of a material softer than that of the protective layer.

An electronic apparatus according to the present invention includes the above EL device.

A method for manufacturing an EL device according to the present invention includes the steps of forming a second electrode to cover electroluminescent layers disposed on a first electrode, the second electrode having a surface being composed of an inorganic oxide, and forming a barrier layer such that at least one portion of the barrier layer comes into direct contact with the second electrode, the barrier layer being composed of an inorganic compound.

According to the present invention, at least one portion of the barrier layer, which is composed of an inorganic compound, can be formed such that the barrier layer directly contacts the surface composed of an inorganic oxide of the second electrode. Therefore, the gas barrier characteristics of the barrier layer are improved. Since the barrier layer is directly formed on the second electrode, a low-profile EL device can be achieved.

In the method for manufacturing an EL device, the second electrode may be formed by vapor phase deposition.

In the method for manufacturing an EL device, the barrier layer may be formed by vapor phase deposition.

In the method for manufacturing an EL device, the second electrode may be composed of indium tin oxide or indium zinc oxide.

In the method for manufacturing an EL device, the barrier layer may be composed of a silicon compound.

In the method for manufacturing an EL device, the barrier layer may have a sublayer in contact with the second electrode, the sublayer being composed of silicon oxide.

In the method for manufacturing an EL device, the barrier layer may have a sublayer in contact with the second electrode, the sublayer being composed of silicon nitride.

In the method for manufacturing an EL device, the barrier layer may have a sublayer in contact with the second electrode, the sublayer being composed of silicon nitride oxide.

In the method for manufacturing an EL device, the barrier layer may extend over an insulating layer disposed around the second electrode, the insulating layer being composed of a silicon compound.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Figure 1:
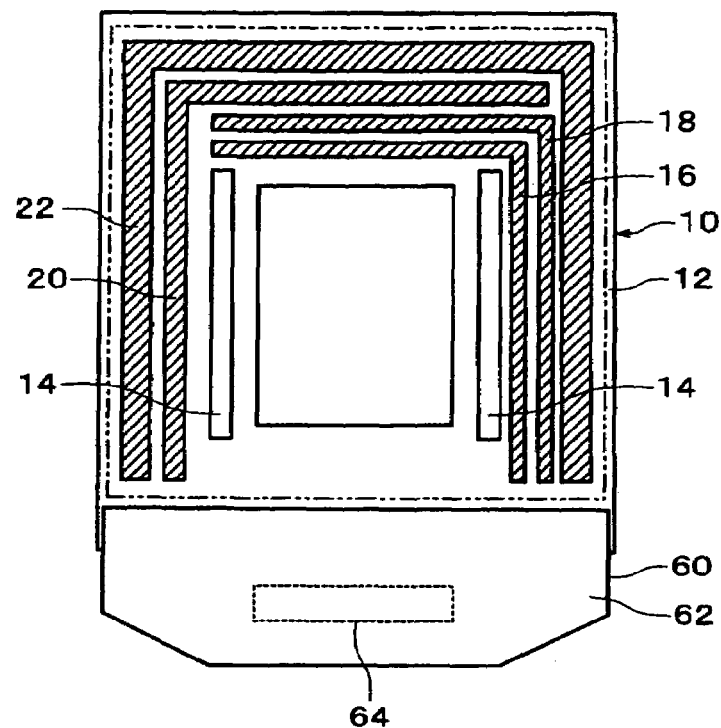
FIG. 1 illustrates an EL device according to a first embodiment of the present invention.

The embodiments according to the present invention will now be described with reference to the drawings. FIG. 1 illustrates an electroluminescent (EL) device according to a first embodiment of the present invention. An EL device 10 includes a substrate 12. The substrate 12 may be a glass substrate, a plastic substrate, or a silicon substrate. If the EL device 10 is a top-emission-type device wherein light is emitted from the opposite side of the substrate 12, the substrate 12 does not require optical transparency. On the other hand, if the EL device 10 is a bottom-emission-type device wherein light is emitted from above the substrate 12, the substrate 12 requires optical transparency.

The EL device 10 includes a pair of scanning drivers 14. The scanning drivers 14 may be chips or thin film circuits (for example, circuits having TFTs) disposed on the substrate 12.

The EL device 10 can include a plurality of anode lines 16, 18, and 20. The anode lines 16, 18, and 20 are lines for applying an electric current to EL layers 40 (see FIG. 2). The anode lines 16, 18, and 20 have different widths. This structure is suited to apply different amounts of current depending on the difference in luminous efficiency for the colors (R, G, B) of the EL layers 40. The EL device 10 includes a cathode line 22. The cathode line 22 is disposed outside of the anode lines 16, 18, and 20. The cathode line 22 is disposed in a U shape (or a C shape) so as to be away from the side for installing a wiring board.

Figure 2:
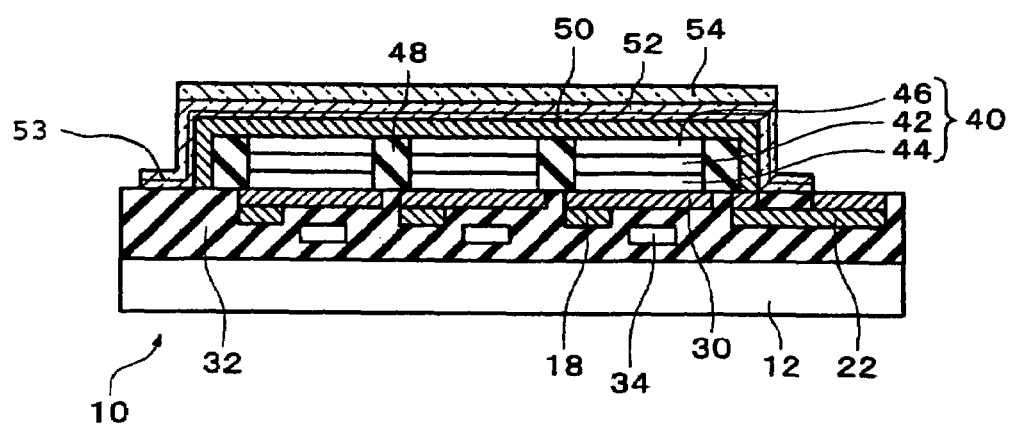
FIG. 2 is a sectional view of the EL device according to the first embodiment of the present invention.

FIG. 2 is a sectional view of the EL device according to the embodiment of the present invention. The EL device 10 can include a plurality of first electrodes 30. Each of the first electrodes 30 is electrically connected to a corresponding one of the anode lines 16, 18, and 20. If the substrate 12 is not composed of an electrical insulator, an insulating layer 32 may be formed between the first electrodes 30 and the substrate 12. If the substrate 12 is composed of silicon, the insulating layer 32 may be composed of a silicon compound (for example, silicon oxide, silicon nitride, or silicon nitride oxide). The insulating layer 32 may be composed of plural layers. A part of the insulating layer 32 may be disposed at the side faces of the first electrodes 30. The first electrodes 30 and the insulating layer 32 may be flush.

The EL device 10 includes switching elements 34 for regulating the current to the first electrodes 30. The switching elements 34 may be covered with the insulating layer 32.

The EL layers 40 are formed on each of the first electrodes 30. The EL layers 40 include a luminescent layer 42. The luminescent layer 42 is composed of high molecular weight or low molecular weight organic material. The luminescent layer 42 emits light by carrier injection. The EL layers 40 may have a composition wherein the luminescent layer 42 is sandwiched between a hole transport layer 44 and an electron transport layer 46. A bank layer 48 is formed between the adjacent EL layers 40. The bank layer 48 is composed of an electrical insulator, which shields the electrical connection between each of the adjacent EL layers 40. The bank layer 48 may be composed of a silicon compound (for example, silicon oxide, silicon nitride, or silicon nitride oxide).

The EL device 10 can include a second electrode 50. The second electrode 50 is formed to cover the EL layers 40 (for example, the side faces and the upper faces of the EL layers 40). The second electrode 50 may cover all of the EL layers 40. The second electrode 50 may cover the bank layer 48. The second electrode 50 may be disposed to cover all of the first electrodes 30. The second electrode 50 may be transparent. At least one surface of the second electrode 50 (a surface facing a barrier layer 52) is composed of inorganic oxide. The second electrode 50 may be composed of indium tin oxide or indium zinc oxide. The second electrode 50 is electrically connected to the cathode line 22. A part of the insulating layer 32 may be disposed around the second electrode 50 (for example, at the bottom of the second electrode 50).

The EL device 10 can include the barrier layer 52, which is composed of at least one sublayer 53. The barrier layer 52 is transparent (for example, the barrier layer 52 has an optical transmittance of at least 80%). The barrier layer 52 is formed in contact with the second electrode 50. At least the surface of the barrier layer 52 facing the second electrode 50 is composed of an inorganic compound (for example, a silicon compound such as silicon oxide, silicon nitride, or silicon nitride oxide). The barrier layer 52 may include at least one sublayer composed of a silicon compound. The barrier layer 52 may include a sublayer composed of silicon oxide or silicon nitride, the sublayer contacting with the second electrode 50. The barrier layer 52 extends over the insulating layer 32. The barrier layer 52 has a thickness ranging from 10 nm to 300 nm, for example about 100 nm.

According to the present embodiment, the surface having an inorganic compound of the barrier layer 52 directly contacts with the surface having an inorganic oxide of the second electrode 50, thereby improving the gas barrier characteristics of the barrier layer 52. Also, the gas barrier characteristics are improved at the sublayer of the barrier layer 52 composed of the silicon compound, which is disposed on the insulating layer 32 (for example, the bottom part of the barrier layer 52). Furthermore, the barrier layer 52 is directly formed on the second electrode 50, thereby achieving a low-profile EL device 10.

A protective layer 54 may be formed on the barrier layer 52. The protective layer 54 is transparent (for example, the protective layer 54 has an optical transmittance of at least 80%). The protective layer 54 has durability or an anti-reflecting function, and may have a gas barrier ability. The protective layer 54 may be composed of, for example, glass, a plastic film, a polymer layer including carbon atoms, diamond-like carbon, and a fluorocarbon polymer.

Referring to FIG. 1, a wiring board 60 is attached to the EL device 10, thereby composing an EL module. The wiring board 60 includes a substrate 62. The substrate 62 may be a flexible substrate. Wiring patterns (not shown in the figure) are formed on the substrate 62. Anisotropic conductive materials (such as an anisotropic conducting film and an anisotropic conducting paste) may be used for electrically connecting the EL device 10 and the wiring board 60.

An integrated circuit chip 64 is mounted on the wiring board 60. A signal driver having a function for generating signals to the EL device 10 may be formed in the integrated circuit chip 64. The integrated circuit chip 64 may be electrically connected to the substrate 62 by flip-chip bonding or tape automated bonding (i.e., TAB).

The EL device according to the present embodiment can be composed as described above, and the manufacturing method of the EL device will now be described. In the method for manufacturing the EL device, the second electrode 50 is formed to cover the EL layers 40 disposed on the first electrodes 30, the second electrode 50 having a surface composed of an inorganic oxide. Then the barrier layer 52 is formed such that at least one portion of the barrier layer 52 directly contacts with the second electrode 50, the barrier layer 52 being composed of an inorganic compound.

The second electrode 50 may be formed by vapor phase deposition (such as sputtering and chemical vapor deposition (CVD)). The barrier layer 52 may be formed by vapor phase deposition (such as sputtering and chemical vapor deposition (CVD)). The vapor phase deposition may be performed in a reduced pressure atmosphere. Since other conditions are the same as in the description of the above EL device, the conditions are not described.

According to the present embodiment, at least one portion of the barrier layer 52, which is composed of an inorganic compound, is formed such that the barrier layer 52 directly contacts the surface composed of an inorganic oxide of the second electrode 50. Therefore, the gas barrier characteristics of the barrier layer 52 are improved. Since the barrier layer 52 is directly formed on the second electrode 50, a low-profile EL device 10 can be achieved.

Figure 3:
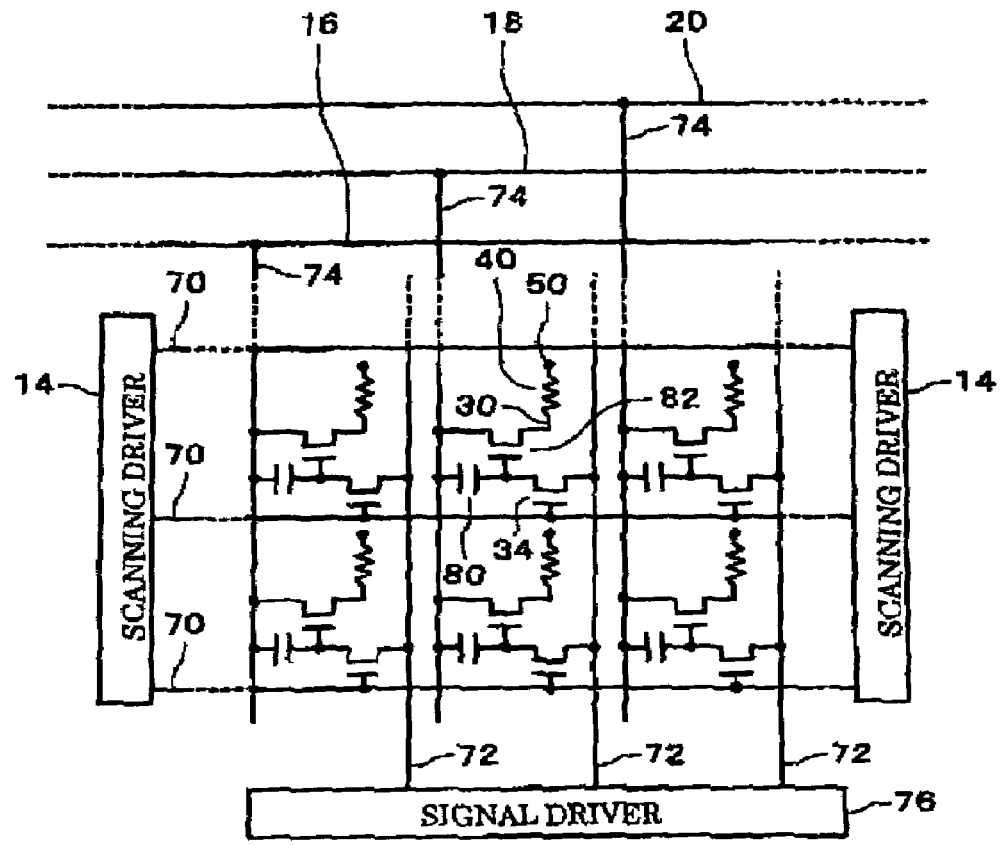
FIG. 3 is a circuit diagram of the EL device according to the first embodiment of the present invention.

FIG. 3 illustrates a circuit of an EL module including an EL device according to the present embodiment. The EL device 10 includes a plurality of scanning lines 70, a plurality of signal lines 72 extending in the direction perpendicular to the scanning lines 70, and a plurality of power lines 74 extending in the direction parallel to the signal lines 72. The scanning lines 70 are electrically connected to the scanning drivers 14 (for example, the scanning drivers 14 include shift registers and level shifters). Signal lines 72 are electrically connected to the signal driver 76 of the integrated circuit chip 64. The power lines 74 are electrically connected to the corresponding anode lines 16, 18, and 20. The EL layers 40, which form pixels, are correspondingly disposed at each intersection of the scanning lines 70 and the signal lines 72.

The switching elements 34 are electrically connected to the scanning lines 70, corresponding to the pixels. If the switching elements 34 are composed of thin-film transistors (metal-oxide semiconductor field-effect transistors (MOSFETs)), the scanning lines 70 are electrically connected to gate electrodes of the transistors. Capacitors 80 are electrically connected to the signal lines 72, corresponding to the pixels. Specifically, the capacitors 80 are electrically connected between the corresponding signal lines 72 and the power lines 74, and the capacitors 80 hold electric charges corresponding to picture signals from the signal lines 72. The switching elements 34 are electrically connected between the corresponding capacitors 80 and the signal lines 72. The switching elements 34 are controlled by scanning signals from the scanning lines 70. The switching elements 34 control charge accumulation to the capacitors 80.

Driving elements 82 are regulated depending on the amount of electric charges held in the capacitors 80, or whether or not electric charges exist. If the driving elements 82 are composed of thin-film transistors (metal-oxide semiconductor field-effect transistors (MOSFETs)), gate electrodes of the transistors are electrically connected to electrodes of the capacitors 80, the electrodes being disposed at the signal line 72 side. The driving elements 82 are electrically connected between the corresponding power lines 74 and the EL layers 40. Accordingly, the driving elements 82 regulate the current supply from the power lines 74 to the EL layers 40.

According to this composition, when the switching elements 34 are placed in the ON state by scanning signals from the signal lines 72, electric charges are held at the capacitors 80 due to the difference in potential between the signal lines 72 and the power lines 74. The control state of the driving elements 82 depends on the electric charges. Then current flows from the power lines 74 to the first electrodes 30 through channels of the driving elements 82, and to the second electrode 50 through the EL layers 40. The EL layers 40 emit light depending on the amount of current flowing therethrough.

Figure 4:
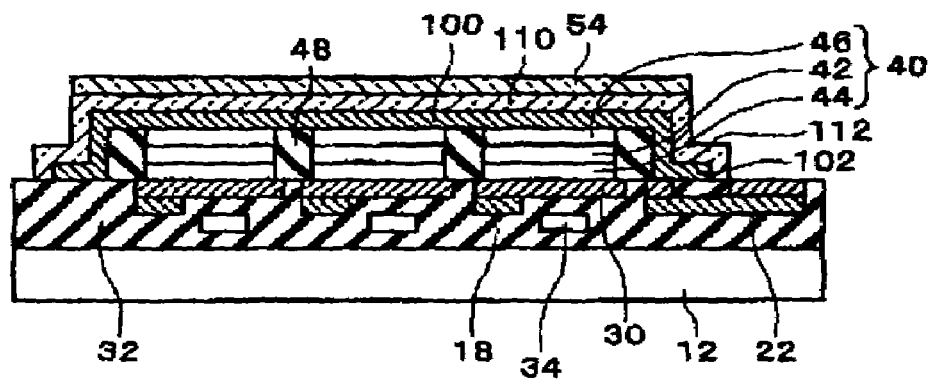
FIG. 4 is a sectional view of an EL device according to a second embodiment of the present invention.

FIG. 4 illustrates an EL device according to a second embodiment of the present invention. According to this embodiment, a second electrode 100 includes an upper portion covering the upper part of the EL layers 40, side portions extending down from the upper portion, and flange portions 102 extending from the side portions towards the outside. A barrier layer 110 includes an upper barrier portion contacting the upper portion of the second electrode 100, side barrier portions contacting the side portions of the second electrode 100, and flange barrier portions 112 contacting the flange portions 102 of the second electrode 100. According to the present embodiment, the barrier layer 110 has flange barrier portions 112, thereby sealing the area from the EL layers 40 to a position away from the EL layers 40. Therefore, the gas barrier characteristics are further improved. Other compositions, manufacturing methods, and operations and advantages correspond to the description according to the first embodiment.

Figure 5:
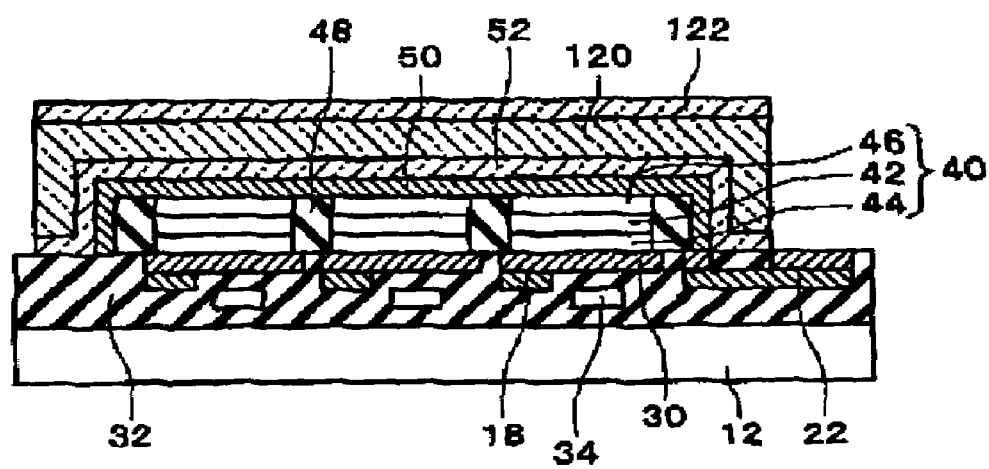
FIG. 5 is a sectional view of an EL device according to a third embodiment of the present invention.

FIG. 5 illustrates an EL device according to a third embodiment of the present invention. According to the present embodiment, an adhesive layer 120 is disposed on a barrier layer 52. Furthermore, a protective layer 122 is disposed on the adhesive layer 120. The protective layer 122 corresponds to the protective layer 54 described in the first embodiment. The adhesive layer 120 may be composed of, for example, polyurethane resin, acrylic resin, epoxy resin, and polyolefin. The adhesive layer 120 is transparent. If the adhesive layer 120 is composed of a material softer than that of the protective layer 122 (for example, a material having a low glass transition point), the adhesive layer 120 absorbs external impacts. Other compositions, manufacturing methods, and operations and advantages correspond to the description according to the first embodiment.

Figure 6:
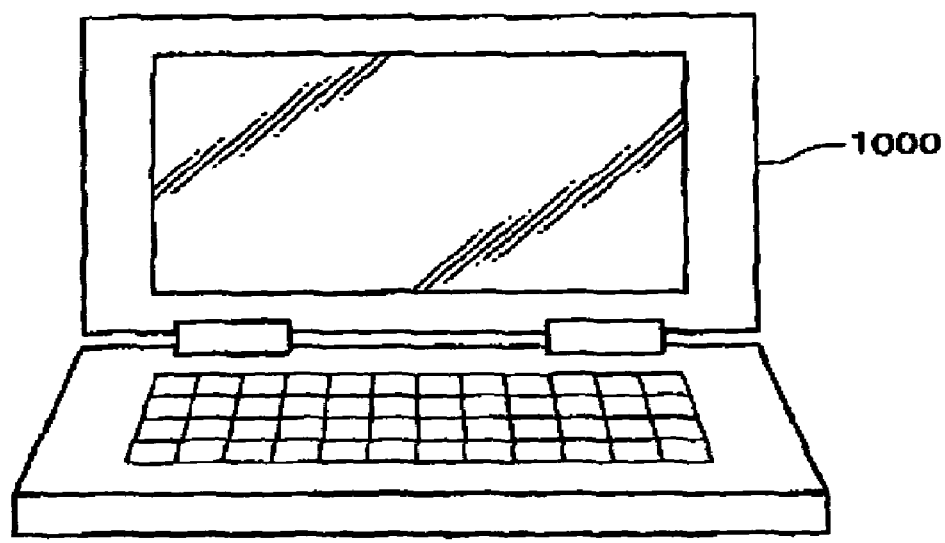
FIG. 6 illustrates an electronic apparatus according to an embodiment of the present invention.
Figure 7:
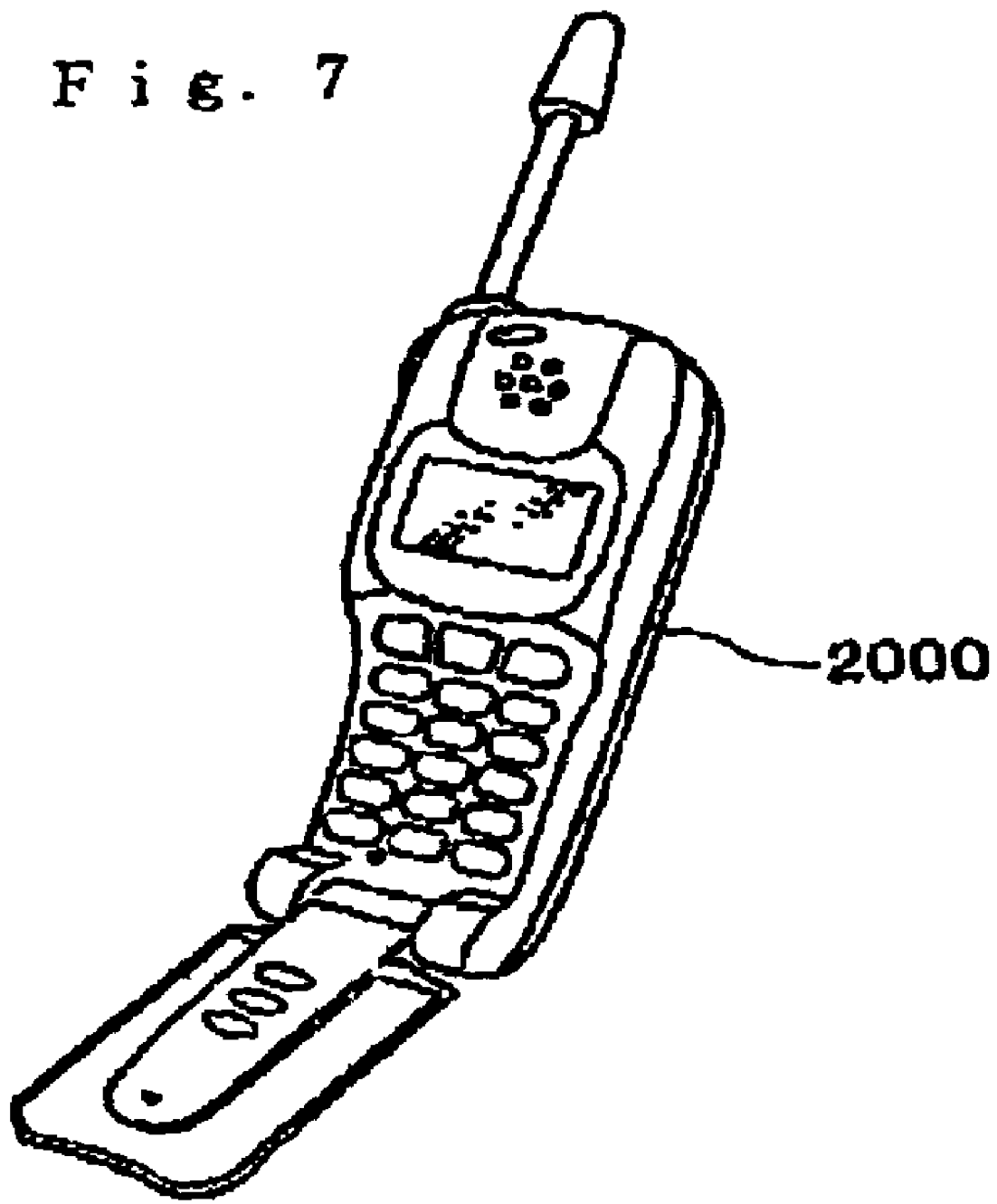
FIG. 7 illustrates an electronic apparatus according to an embodiment of the present invention.

As examples of electronic apparatuses having an EL device according to the present invention, FIG. 6 illustrates a notebook personal computer 1000, and FIG. 7 illustrates a cell phone 2000.

It should be understood that the present invention is not limited to the above embodiments and various modifications are possible. For example, the present invention includes substantially the same compositions (for example, compositions having the same functions, manufacturing methods, and results, or compositions having the same objects and results) described in the above embodiments. The present invention can include compositions wherein non-essential parts of the composition described in the above embodiments are substituted. The present invention includes compositions resulting in the same operations and the same advantages, or compositions achieving the same objects described in the above embodiments. Furthermore, the present invention includes compositions wherein conventional-art materials are added to the compositions described in the above embodiments.

Experiments have been performed to confirm the advantages of the present invention. A barrier layer composed of an inorganic compound, an inorganic oxide layer, a metal layer, and a resin layer were used in the experiments.

The barrier layer was deposited by electron cyclotron resonance plasma sputtering. Si was used as a target material. The degree of vacuum was 0.2 Pa, and Ar and $O_2$ were introduced. The layer had a thickness of 70 nm.

The inorganic oxide layer was deposited by magnetron DC sputtering. InSnO was used as a target material. The degree of vacuum was 0.4 Pa, and Ar and $O_2$ were introduced. The layer had a thickness of 100 nm.

The metal layer was deposited by resistance heating evaporation. High purity Al was used as a material. The degree of vacuum was $1.0 \times 10^{-5}$ Pa. The layer had a thickness of 100 nm.

The resin layer was composed of polyethylene terephthalate. The layer had a thickness of 188 μm.

A water vapor permeability ($g/m^2$.24 hours: 60° C. 90% RH) was measured according to JIS-Z0208 (Japanese Industrial Standards). The results were as follows.

The water vapor permeability of a layered product including the resin layer, the inorganic oxide layer, and the barrier layer was 0.04. Accordingly, the water vapor permeability of the barrier layer was calculated to be 0.04.

The water vapor permeability of a layered product including the resin layer and the barrier layer was 1.76. Accordingly, the water vapor permeability of the barrier layer was calculated to be 2.18.

The water vapor permeability of a layered product including the resin layer, the metal layer, and the barrier layer was 0.41. Accordingly, the water vapor permeability of the barrier layer was calculated to be 0.81. The water vapor permeability of the resin layer was 9.19.

According to the above experimental results, when the barrier layer composed of the inorganic compound was deposited on the inorganic oxide layer, the lowest water vapor permeability (the highest gas barrier capacity) was achieved. This result validates the advantages of the present invention.

What is claimed is:

1. An electroluminescent device, comprising:
   first electrodes;
   electroluminescent layers disposed over the first electrodes;
   a second electrode disposed over the electroluminescent layers and having a first surface that includes an inorganic oxide; and
   a barrier layer having a second surface that includes an inorganic compound, the second surface of the barrier layer being in direct contact with the first surface of the second electrode.

2. The electroluminescent device according to claim 1, the second electrode including indium tin oxide or indium zinc oxide.

3. The electroluminescent device according to claim 1, the second electrode covering side faces and upper faces of the electroluminescent layers.

4. The electroluminescent device according to claim 1, the barrier layer including at least one sublayer composed of a silicon compound.

5. The electroluminescent device according to claim 4, the barrier layer including a sublayer in contact with the second electrode, the sublayer being composed of silicon oxide.

6. The electroluminescent device according to claim 4, the barrier layer including a sublayer in contact with the second electrode, the sublayer being composed of silicon nitride.

7. The electroluminescent device according to claim 4, the barrier layer including a sublayer in contact with the second electrode, the sublayer being composed of silicon nitride oxide.

8. The electroluminescent device according to claim 1, further comprising:
   an insulating layer disposed around the second electrode, the insulating layer being composed of a silicon compound,
   the barrier layer extending to the insulating layer.

9. The electroluminescent device according to claim 1, further comprising:
   a protective layer that covers the barrier layer.

10. The electroluminescent device according to claim 9, further comprising:
    an adhesive layer disposed between the barrier layer and the protective layer.

11. The electroluminescent device according to claim 10, the adhesive layer including a material that is softer than that of the protective layer.

12. An electronic apparatus comprising the electroluminescent device according to claim 1.

13. An electroluminescent device comprising:
    first electrodes;
    electroluminescent layers being disposed over the first electrodes;
    a second electrode being disposed over the electroluminescent layers and including an inorganic oxide; and
    a barrier layer including an inorganic compound,
    the inorganic oxide of the second electrode directly contacting the inorganic compound of the barrier layer.

14. An electroluminescent device comprising:
    first electrodes;
    electroluminescent layers disposed over the first electrodes;
    a second electrode being disposed over the electroluminescent layers and including an inorganic oxide; and
    a barrier layer being disposed on the second electrode and including silicon compound,
    the inorganic oxide of the second electrode directly contacting the silicon compound of the barrier layer.

15. An electroluminescent device comprising:
    anodes;
    electroluminescent layers disposed over the anodes;
    a cathode being disposed over the electroluminescent layers and including an inorganic conductive oxide; and
    a barrier layer including an inorganic compound,
    the inorganic conductive oxide of the cathode directly contacting the inorganic compound of the barrier layer.

* * * * *